(12) United States Patent
Maeda

(10) Patent No.: US 8,338,956 B2
(45) Date of Patent: Dec. 25, 2012

(54) SEMICONDUCTOR DEVICE AND METHOD FOR MANUFACTURING SAME

(75) Inventor: Hiroyuki Maeda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 12/876,834

(22) Filed: Sep. 7, 2010

(65) Prior Publication Data

US 2011/0108907 A1    May 12, 2011

(30) Foreign Application Priority Data

Nov. 9, 2009 (JP) ................. 2009-256029

(51) Int. Cl.
*H01L 23/522* (2006.01)
(52) U.S. Cl. .......... 257/773; 257/E23.145; 257/E23.151
(58) Field of Classification Search ................. 257/773, 257/E23.011, E23.145, E23.151
See application file for complete search history.

(56) References Cited

U.S. PATENT DOCUMENTS

| | | |
|---|---|---|
| 7,135,726 B2 | 11/2006 | Endoh et al. |
| 8,164,134 B2 * | 4/2012 | Kim et al. ............... 257/314 |
| 2008/0099819 A1 | 5/2008 | Kito et al. |
| 2008/0253183 A1 | 10/2008 | Mizukami et al. |
| 2010/0039865 A1 | 2/2010 | Kidoh et al. |
| 2010/0117143 A1 * | 5/2010 | Lee et al. ............... 257/329 |

FOREIGN PATENT DOCUMENTS

JP    2007-266143    10/2007

* cited by examiner

*Primary Examiner* — Wensing Kuo
(74) *Attorney, Agent, or Firm* — Oblon, Spivak, McClelland, Maier & Neustadt, L.L.P.

(57) ABSTRACT

According to one embodiment, a semiconductor device includes a substrate, a foundation layer, a lower layer side stacked body, an upper layer side stacked body, an inter-layer insulating layer, and a plurality of contact electrodes. The foundation layer is provided in the second contact region to form a difference in levels between the second contact region and the first contact region. The lower layer side stacked body includes a plurality of conductive layers stacked alternately with a plurality of insulating layers. An upper level portion of the lower layer side stacked body stacked on the foundation layer is patterned into a stairstep configuration. The upper layer side stacked body is provided on a lower level portion of the lower layer side stacked body stacked in the first contact region. The upper layer side stacked body includes a plurality of conductive layers stacked alternately with a plurality of insulating layers.

12 Claims, 12 Drawing Sheets

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2009-256029, filed on Nov. 9, 2009; the entire contents of which are incorporated herein by reference.

FIELD

Embodiments described herein relate generally to a semiconductor device and a method for manufacturing the same.

BACKGROUND

Memory device technology that three-dimensionally arranges memory cells has been discussed in, for example, JP-A 2007-266143. The memory device technology includes making memory holes in a stacked body in which a conductive layer, which functions as a control gate, and an insulating layer are multiply stacked alternately. A charge storage layer is formed on the inner walls of the memory holes, and silicon is subsequently provided in the memory holes.

Further, JP-A 2007-266143 discusses a stairstep structure of the conductive layers as a structure to connect each of the multiple stacked conductive layers to an upper layer interconnection. In other words, the conductive layers of lower layers are longer. A contact hole is made in an inter-layer insulating layer covering the stairstep structure to reach each of the conductive layers in the stairstep configuration; and a contact electrode is filled into the contact hole.

The depths of the contact holes reaching the conductive layers in the stairstep configuration are different. In the case where such contact holes are etched collectively, the etching processing time of the shallower contact holes connected to the conductive layers of the upper levels is relatively long. Such conditions may undesirably cause shorts between different conductive layers when a contact hole on the upper level side extends through the conductive layer of the intended connection to reach another conductive layer therebelow.

DETAILED DESCRIPTION

According to one embodiment, a semiconductor device includes a substrate, a foundation layer, a lower layer side stacked body, an upper layer side stacked body, an inter-layer insulating layer, and a plurality of contact electrodes. The substrate has a first contact region and a second contact region. The foundation layer is provided in the second contact region to form a difference in levels between the second contact region and the first contact region. The lower layer side stacked body is provided in the first contact region and the second contact region to cover the foundation layer. The lower layer side stacked body includes a plurality of conductive layers stacked alternately with a plurality of insulating layers. An upper level portion of the lower layer side stacked body stacked on the foundation layer is patterned into a stairstep configuration. The upper layer side stacked body is provided on a lower level portion of the lower layer side stacked body stacked in the first contact region. The upper layer side stacked body includes a plurality of conductive layers stacked alternately with a plurality of insulating layers. The upper layer side stacked body is patterned into a stairstep configuration. The inter-layer insulating layer covers portions of the lower layer side stacked body and the upper layer side stacked body patterned into the stairstep configurations. The plurality of contact electrodes are provided respectively in a plurality of contact holes punched through the inter-layer insulating layer to reach the conductive layers of the portions of the lower layer side stacked body and the upper layer side stacked body patterned into the stairstep configurations.

Figure 1:
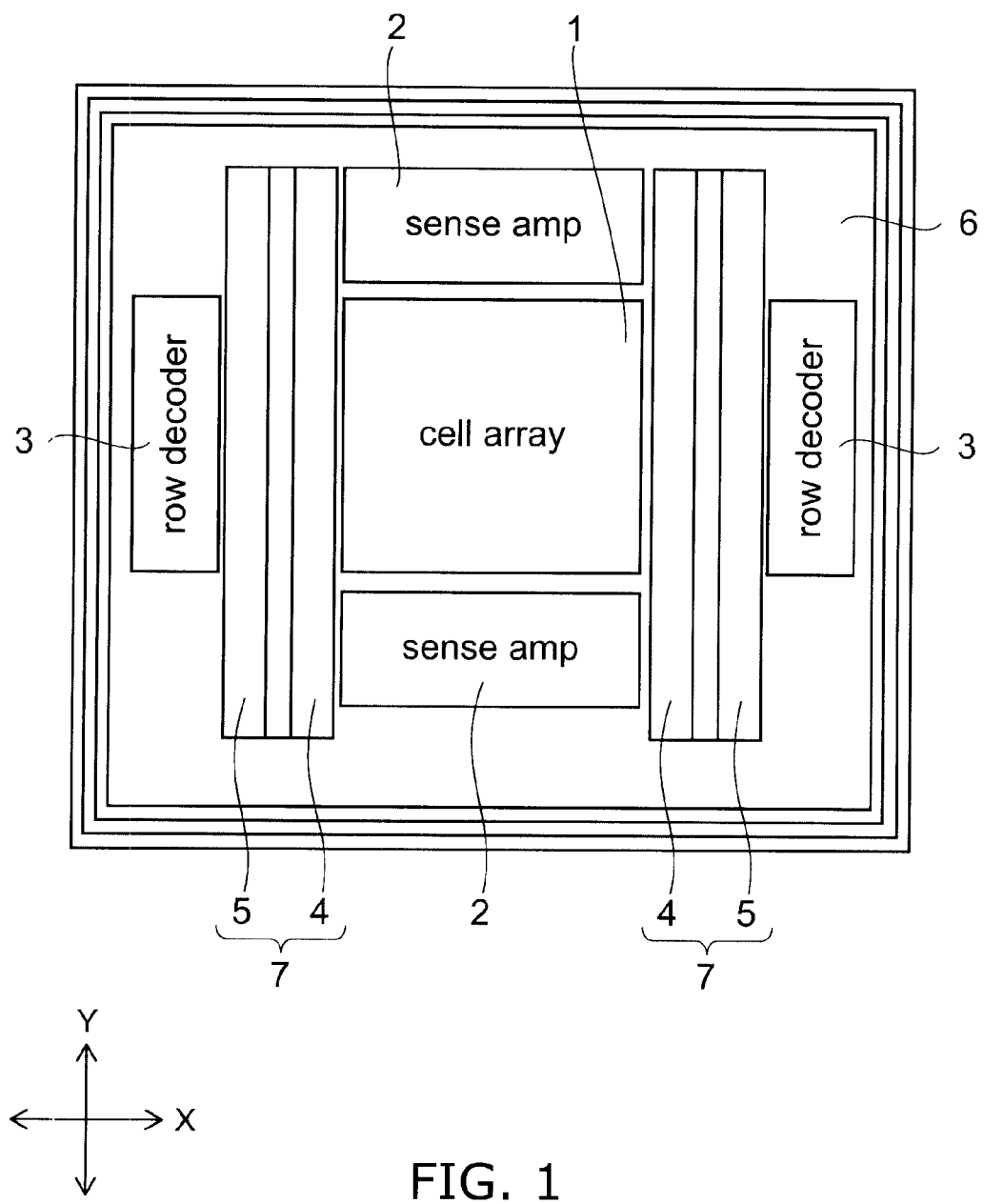
FIG. 1 is a schematic view illustrating a planar layout of the main components of a semiconductor device according to an embodiment.

FIG. 1 is a schematic view illustrating a planar layout of the main components of a semiconductor device according to an embodiment. FIG. 1 illustrates one chip; and the region inside the one chip may be divided mainly into a memory cell region 1 and a peripheral circuit region 6.

The memory cell region 1 is formed in the center of the chip; and a memory cell array is formed in the memory cell region 1. The peripheral circuit region 6 is formed in the periphery of the memory cell region 1; and a row decoder 3, a sense amplifier 2, other circuits, etc., are formed in the peripheral circuit region 6. The memory cell array includes multiple conductive layers that function as word electrodes or control gates. Each layer of the conductive layers is connected to an upper layer interconnection (a word line) in a contact region 7 between the memory cell region 1 and the row decoder 3 that applies a potential to each of the conductive layers.

Figure 2:
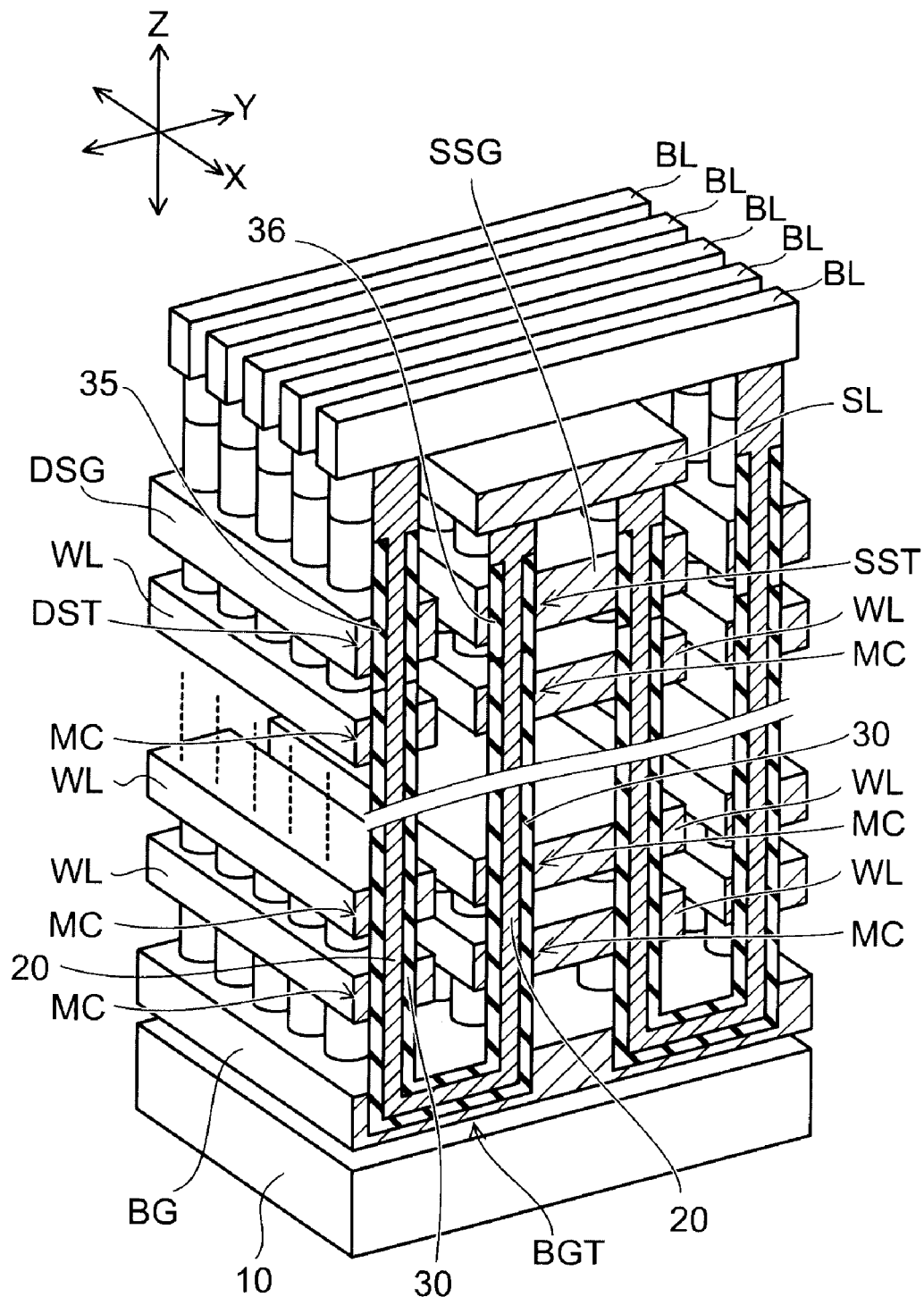
FIG. 2 is a schematic view of a memory cell array of the semiconductor device.

FIG. 2 illustrates the configuration of a memory cell array of a semiconductor device according to this embodiment. For easier viewing of the drawing in FIG. 2, the insulating portions other than the insulating film formed in the memory holes are not illustrated. Although silicon is used as the semiconductor in the examples of the embodiments hereinbelow, semiconductors other than silicon may be used.

For convenience of description in the specification, an XYZ orthogonal coordinate system will now be introduced. In this coordinate system, two mutually orthogonal directions parallel to a major surface of a substrate 10 are taken as an X direction and a Y direction; and a direction orthogonal to both the X direction and the Y direction is taken as a Z direction. Multiple conductive layers WL are stacked in the Z direction.

A back gate BG is provided above the substrate 10 via a not-illustrated insulating layer. The back gate BG is, for example, a conductive silicon layer to which an impurity is added. Multiple conductive layers WL are stacked alternately with not-illustrated insulating layers above the back gate BG. The conductive layer WL is, for example, a conductive silicon layer to which an impurity is added.

The conductive layers WL are divided into multiple blocks by trenches aligned in the X direction. A drain-side select gate DSG is provided in one block above the conductive layer WL of the uppermost layer via a not-illustrated insulating layer. The drain-side select gate DSG is, for example, a conductive silicon layer to which an impurity is added. A source-side select gate SSG is provided in one other block adjacent to the one block above the conductive layer WL of the uppermost layer via a not-illustrated insulating layer. The source-side select gate SSG is, for example, a conductive silicon layer to which an impurity is added.

A source line SL is provided above the source-side select gate SSG via a not-illustrated insulating layer. The source line SL is, for example, a conductive silicon layer to which an impurity is added. Alternatively, a metal material may be used as the source line SL. Multiple bit lines BL are provided above the source line SL and the drain-side select gate DSG via a not-illustrated insulating layer. Each of the bit lines BL is aligned in the Y direction.

A memory hole having a U-shaped configuration is multiply made in the stacked body above the substrate 10. A memory hole punched through the drain-side select gate DSG and the conductive layers WL therebelow and aligning in the Z direction, is made in the block including the drain-side select gate DSG. A memory hole punched through the source-side select gate SSG and the conductive layers WL therebelow and aligning in the Z direction, is made in the block including the source-side select gate SSG. These two memory holes communicate with each other via a memory hole made in the back gate BG to align in the Y direction.

A channel body 20 is provided as a silicon layer having a U-shaped configuration in the interior of the memory hole. A gate insulating film 35 is formed on the inner wall of the memory hole between the drain-side select gate DSG and the channel body 20. A gate insulating film 36 is formed on the inner wall of the memory hole between the source-side select gate SSG and the channel body 20. An insulating film 30 is formed on the inner wall of the memory hole between the channel body 20 and each of the conductive layers WL. The insulating film 30 is formed also on the inner wall of the memory hole between the channel body 20 and the back gate BG. The insulating film 30 has, for example, an Oxide-Nitride-Oxide (ONO) structure in which a silicon nitride film is interposed between a pair of silicon oxide films.

Figure 3:
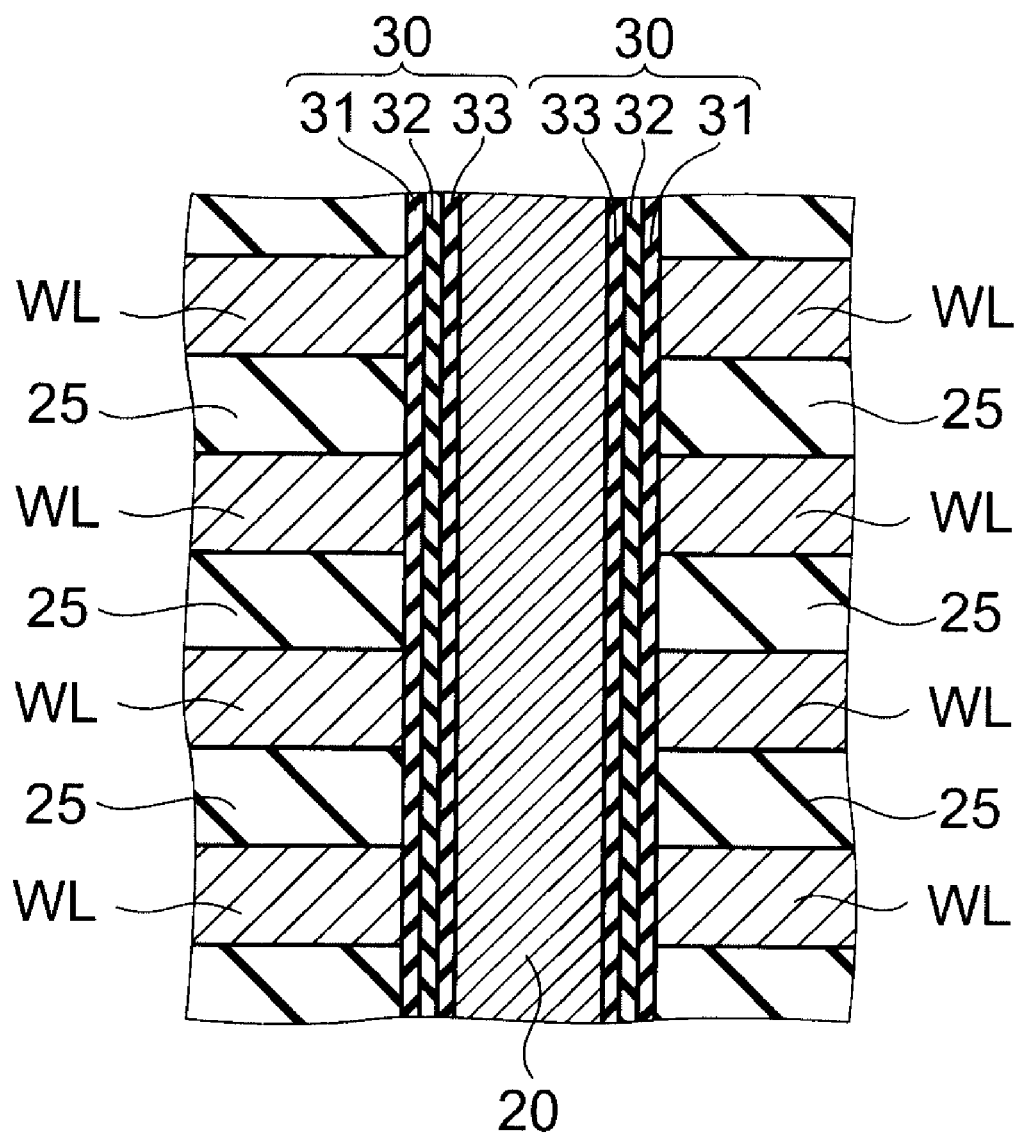
FIG. 3 is an enlarged cross-sectional view of a main portion of the memory cell array.

FIG. 3 illustrates an enlarged cross section of a portion in which the channel body 20 pierces the multiple conductive layers WL and multiple inter-layer insulating layers 25. The insulating layers between the conductive layers WL not illustrated in FIG. 2 are illustrated in FIG. 3 as the insulating layers 25.

A first insulating film 31, a charge storage layer 32, and a second insulating film 33 are provided in order from the conductive layer WL side between the channel body 20 and each of the conductive layers WL. The first insulating film 31 contacts the conductive layers WL; the second insulating film 33 contacts the channel body 20; and the charge storage film 32 is provided between the first insulating film 31 and the second insulating film 33.

The channel body 20 functions as a channel; the conductive layer WL functions as a control gate; and the charge storage layer 32 functions as a data memory layer to store charge injected from the channel body 20. A memory cell having a structure in which a control gate encloses the periphery of a channel is formed at the intersection between the channel body 20 and each of the conductive layers WL.

The semiconductor device according to this embodiment is a nonvolatile semiconductor memory device in which the erasing/writing of data can be freely performed electrically and the memory content can be maintained even when the power source is switched OFF. For example, the memory cell has a charge trap structure. The charge storage layer 32 is made of, for example, a silicon nitride film having many traps that trap charge (electrons). The second insulating film 33 is made of, for example, a silicon oxide film that forms a potential barrier when charge is injected from the channel body 20 into the charge storage film 32 or when the charge stored in the charge storage film 32 is diffused into the channel body 20. The first insulating film 31 is made of, for example, a silicon oxide film that prevents the charge stored in the charge storage film 32 from diffusing into the conductive layer WL.

Turning now once again to FIG. 2, a drain-side selection transistor DST is formed of the drain-side select gate DSG, the channel body 20 piercing the drain-side select gate DSG, and the gate insulating film 35 provided between the channel body 20 and the drain-side select gate DSG. The upper end portions of the channel bodies 20 protruding upward from the drain-side select gate DSG are connected to the corresponding bit lines BL.

A source-side selection transistor SST is formed of the source-side select gate SSG, the channel body 20 piercing the source-side select gate SSG, and the gate insulating film 36 provided between the channel body 20 and the source-side select gate SSG. The upper end portion of the channel body 20 protruding upward from the source-side select gate SSG is connected to the source line SL.

A back gate transistor BGT is formed of the back gate BG, the channel body 20 provided in the back gate BG, and the insulating film 30 between the channel body 20 and the back gate BG.

A memory cell MC having the conductive layer WL as a control gate is multiply provided corresponding to the number of layers of the conductive layers WL between the drain-side selection transistor DST and the back gate transistor BGT.

Similarly, the memory cell MC having the conductive layer WL as the control gate is multiply provided corresponding to the number of layers of the conductive layers WL also between the back gate transistor BGT and the source-side selection transistor SST.

Such memory cells MC, the drain-side selection transistor DST, the back gate transistor BGT, and the source-side selection transistor SST are connected in series to form one memory string. By multiply arranging such a memory string in the X direction and the Y direction, multiple memory cells MC are provided three-dimensionally in the X direction, the Y direction, and the Z direction.

Figure 4:
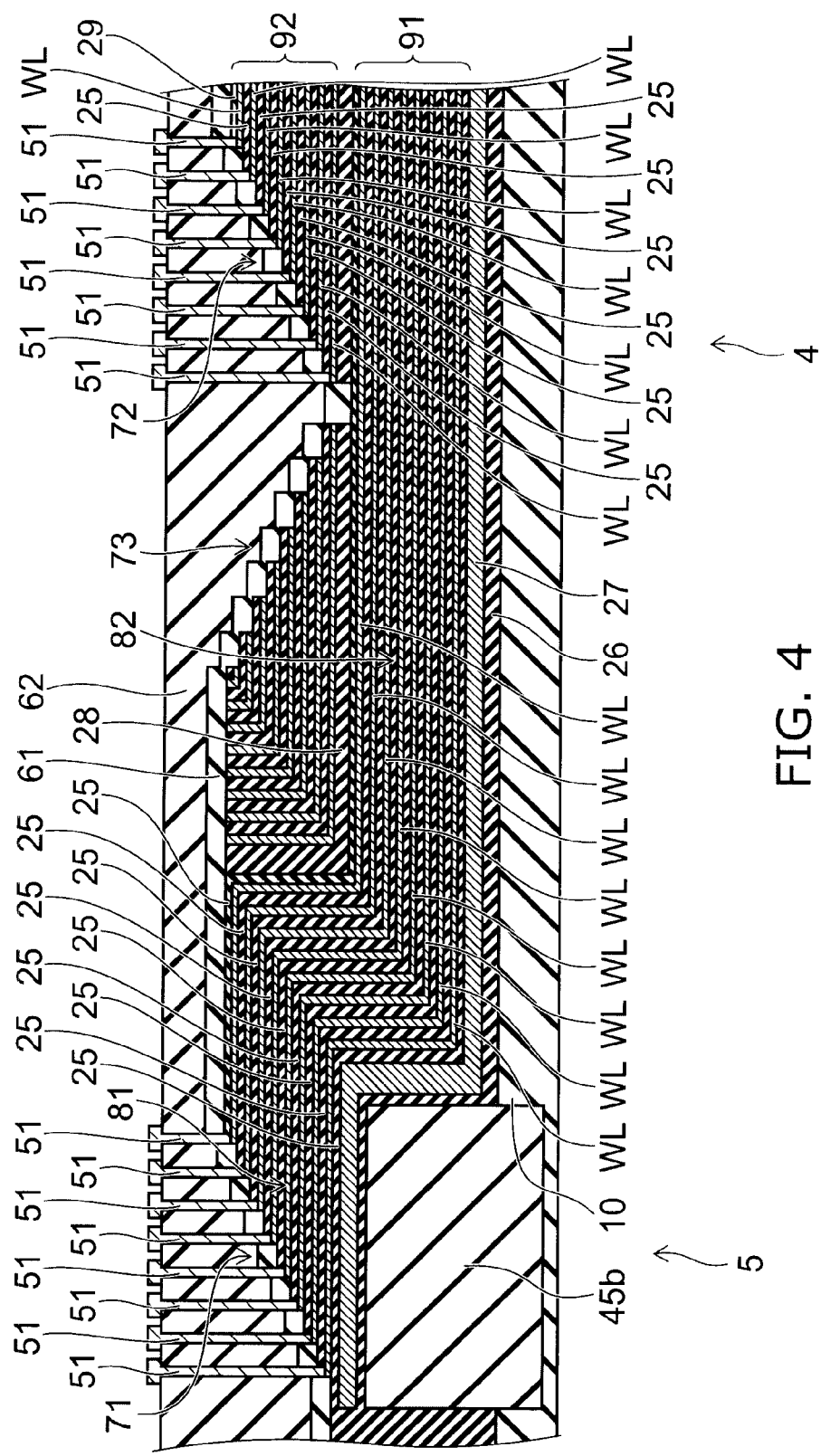
FIG. 4 is a schematic cross-sectional view of a contact structure of the semiconductor device.

FIG. 4 illustrates the cross-sectional structure of a contact region that connects a not-illustrated upper layer interconnection to each of the conductive layers WL. The contact region includes a first contact region 4 and a second contact region 5. As illustrated in FIG. 1, the layout includes the first contact region 4 provided in a region between the memory cell region 1 and the row decoder 3 on the side proximal to the memory cell region 1; and the layout includes the second contact region 5 provided in the region between the memory cell region 1 and the row decoder 3 on the side proximal to the row decoder 3. In other words, the layout includes the first contact region 4 provided between the memory cell region 1 and the second contact region 5.

A foundation layer 45b is provided in the second contact region 5. The foundation layer 45b is, for example, an insulating layer such as silicon oxide. As described below, the foundation layer 45b may be formed simultaneously during the formation of an element separation layer having an Shallow Trench Isolation (STI) structure to separate the transistor elements formed in the peripheral circuit region 6 from each other.

The foundation layer 45b is provided to protrude from the surface of the substrate 10. The foundation layer 45b is not provided in the first contact region 4. Accordingly, a difference in levels is formed between the first contact region 4 and the second contact region 5 by the foundation layer 45b.

A stacked body including the conductive layers WL and the insulating layers 25 stacked alternately similarly to the memory cell array described above, is provided also in the contact region. In the memory cell region 1, for example, a stacked body including sixteen layers of the conductive layers WL is stacked above the substrate 10. As described above, multiple memory cells MC having the conductive layers WL as control gates are formed. Each of the conductive layers WL and each of the insulating layers 25 in the memory cell region 1 spread in directions substantially parallel to the major surface of the substrate 10.

To describe the stacked body of the contact region, it is taken that the stacked body including the sixteen layers of the conductive layers WL is divided into, for example, a lower layer side stacked body 91 including the lower eight layers of the conductive layers WL and an upper layer side stacked body 92 including the upper eight layers of the conductive layers WL. The number of layers of the conductive layers WL in the entire stacked body is not limited to sixteen layers; and the number of layers is arbitrary. Further, the number of layers of the conductive layers WL included in the lower layer side stacked body 91 is not limited to being half of the number of layers of the entirety; and the number of layers of the conductive layers WL included in the upper layer side stacked body 92 is not limited to being half of the number of layers of the entirety.

An insulating layer 26 and a conductive layer 27 are formed below the lower layer side stacked body 91. The insulating layer 26 and the conductive layer 27 are formed in the first contact region 4 and the second contact region 5 while covering the foundation layer 45b. The conductive layer 27 is formed also in the memory cell region 1; and the conductive layer 27 in the memory cell region 1 corresponds to the back gate BG of the memory cell array illustrated in FIG. 2. The conductive layer 27 is formed also in the peripheral circuit region 6; the conductive layer 27 of the peripheral circuit region 6 is selectively removed; and the remaining conductive layer 27 functions as gate electrodes of the transistors of the peripheral circuit region 6.

The multiple insulating layers 25 and the multiple (e.g., eight layers) conductive layers WL included in the lower layer side stacked body 91 are stacked alternately on the conductive layer 27. The lower layer side stacked body 91 is formed in the first contact region 4 and the second contact region 5 while covering the foundation layer 45b. Accordingly, a difference in levels is formed in the lower layer side stacked body 91 corresponding to the height of the foundation layer 45b. In other words, the lower layer side stacked body 91 includes an upper level portion 81 on the foundation layer 45b and a lower level portion 82 in the first contact region 4.

The upper level portion 81 of the lower layer side stacked body 91 is patterned into a stairstep configuration. In other words, a stairstep structure portion 71 of the lower layer side stacked body 91 is provided above the foundation layer 45b of the second contact region 5. The conductive layers WL of the lower layer side stacked body 91 are formed simultaneously with the lower eight layers of the conductive layers WL of the memory cell region 1 and are connected as single bodies. In other words, the conductive layers WL of the stairstep structure portion 71 are electrically connected to the conductive layers WL of the lower eight layers of the memory cell region 1, respectively. For example, the conductive layer WL of the lowermost level of the stairstep structure portion 71 is connected to the conductive layer WL of the lowermost layer of the memory cell region 1; and the conductive layer WL of the uppermost level of the stairstep structure portion 71 is connected to the conductive layer WL of the eighth layer from the bottom of the memory cell region 1.

Each of the conductive layers WL and each of the insulating layers 25 of the lower level portion 82 of the lower layer side stacked body 91 spread in directions substantially parallel to the major surface of the substrate 10 in the first contact region 4. The multiple insulating layers 25 and the multiple (e.g., eight layers) conductive layers WL included in the upper layer side stacked body 92 are stacked alternately on the lower level portion 82. The upper layer side stacked body 92 is not stacked on the upper level portion 81 of the lower layer side stacked body 91 including the stairstep structure portion 71.

An insulating layer 28 is provided between the lower layer side stacked body 91 and the conductive layer WL of the lowermost level of the upper layer side stacked body 92. As described below, the insulating layer 28 functions as a stopper layer when planarizing the upper face of the stacked body of the contact region.

The upper layer side stacked body 92 is patterned into a stairstep configuration. In other words, a stairstep structure portion 72 of the upper layer side stacked body 92 is provided in the first contact region 4. The conductive layers WL of the stairstep structure portion 72 are formed simultaneously with the upper eight layers of the conductive layers WL of the memory cell region 1 and are connected as single bodies. In other words, the conductive layers WL of the stairstep structure portion 72 are electrically connected to the conductive layers WL of the upper eight layers of the memory cell region 1, respectively. For example, the conductive layer WL of the lowermost level of the stairstep structure portion 72 is connected to the conductive layer WL of the eighth layer from the top of the memory cell region 1; and the conductive layer WL of the uppermost level of the stairstep structure portion 72 is connected to the conductive layer WL of the uppermost layer of the memory cell region 1.

Although a stairstep structure portion 73, which is different from the stairstep structure portion 72, is formed in the upper layer side stacked body 92, the stairstep structure portion 73 is formed when forming the stairstep structure portion 71 of the lower layer side stacked body 91 as described below; and contact structures are not provided in the stairstep structure portion 73.

A stopper film 61 is provided on the upper level portion 81 of the lower layer side stacked body 91 including the stairstep structure portion 71 and on the upper layer side stacked body 92 including the stairstep structure portion 72. And an inter-layer insulating layer 62 is provided on the stopper film 61. The stopper film 61 and the inter-layer insulating layer 62 are made of mutually different materials. For example, the stopper film 61 is a silicon nitride film; and the inter-layer insulating layer 62 is a silicon oxide layer.

Multiple contact holes 50 (referring to FIG. 12) are punched through the inter-layer insulating layer 62 and the stopper film 61 on the stairstep structure portions 71 and 72. Further, each of the contact holes 50 is punched through one layer of the insulating layer 25 of the corresponding level to reach the conductive layer WL below the insulating layer 25 and in the corresponding level. The upper face of the inter-layer insulating layer 62 is planarized. The depths of the contact holes 50 from the upper face of the inter-layer insulating layer 62 in the stairstep structure portion 71 are different. And the depths of the contact holes 50 from the upper face of the inter-layer insulating layer 62 in the stairstep structure portion 72 are different. The contact holes 50 reaching the conductive layers WL of the lower layers (the lower levels) are deeper or have higher aspect ratios (the ratio of the depth to the hole diameter).

A contact electrode 51 is provided in each of the contact holes 50. The contact electrode 51 may include a combination of, for example, a barrier metal having excellent adhesion such as titanium, titanium nitride, etc., and a metal having excellent fillability such as tungsten, copper, ruthenium, etc. The barrier metal may be formed on the inner wall of each of the contact holes 50; and tungsten, etc., may be filled on the inner side thereof.

Each of the conductive layers WL of the lower eight layers of the memory cell region 1 is connected to an upper layer interconnection via the contact electrode 51 connected to the stairstep structure portion 71 of the lower layer side stacked body 91. Each of the conductive layers WL of the upper eight layers of the memory cell region 1 is connected to an upper layer interconnection via the contact electrode 51 connected to the stairstep structure portion 72 of the upper layer side stacked body 92.

According to this embodiment as described above, a structure is obtained in which a portion of the conductive layers WL on the lower layer side (the end portions in a direction away from the memory cell region 1) is raised to about the same height as the conductive layers WL of the upper layer side by using the foundation layer 45b to raise a portion of the lower layer side stacked body 91. Then, by not providing the upper layer side stacked body 92 on the raised portion, the stairstep structure portion 71 of the lower layer side stacked body 91 can be provided at about the same height as the stairstep structure portion 72 of the upper layer side stacked body 92.

As a result, the depths or the aspect ratios of the contact holes reaching the conductive layers WL of the lower layer side stacked body 91 can be reduced. The deepest contact hole provided in the stairstep structure portions 71 and 72 is shallower than the memory holes which pierce all of the conductive layers WL (e.g., the sixteen layers of the conductive layers WL) of the memory cell array. Accordingly, all of the contact holes are shallower than the memory holes.

Thereby, the difference of the depth or the aspect ratio between the contact hole reaching the conductive layer WL of the uppermost level and the contact hole reaching the lowermost level of the stacked body in which the lower layer side stacked body 91 and the upper layer side stacked body 92 are combined, is reduced. Therefore, the etching time to collectively make the multiple contact holes corresponding to the number of layers of the conductive layers WL can be drastically shortened. Further, because the difference of the depth between the contact holes can be reduced, excessive etching of shallow contact holes can be suppressed. Thereby, shorts can be prevented between different conductive layers WL in which the contact hole extends through to a conductive layer WL other than that of the intended connection.

For example, in this embodiment, the patterning of the stairstep structure portions 71 and 72 is performed after the planarizing of the stacked body surface (the upper face) in the first contact region 4 and the second contact region 5. Accordingly, the height from the major surface of the substrate 10 to the surface of the upper level portion 81 of the lower layer side stacked body 91 is substantially the same as the height from the major surface of the substrate 10 to the surface of the upper layer side stacked body 92. The thickness of the insulating layer 25 of the lower layer side stacked body 91 is substantially equal to the thickness of the insulating layer 25 of the upper layer side stacked body 92. The thickness of the conductive layer WL of the lower layer side stacked body 91 is substantially equal to the thickness of the conductive layer WL of the upper layer side stacked body 92. The number of layers of the conductive layers WL of the lower layer side stacked body 91 is the same as the number of the conductive layers WL of the upper layer side stacked body 92.

Accordingly, the corresponding conductive layers WL of the same level in the stairstep structure portion 71 of the lower layer side stacked body 91 and the stairstep structure portion 72 of the upper layer side stacked body 92 are positioned at substantially the same height from the major surface of the substrate 10. For example, the conductive layer WL of the uppermost level of the stairstep structure portion 71 of the lower layer side stacked body 91 is positioned at substantially the same height from the major surface of the substrate 10 as the conductive layer WL of the uppermost level of the stairstep structure portion 72 of the upper layer side stacked body 92. The conductive layer WL of the lowermost level of the stairstep structure portion 71 of the lower layer side stacked body 91 is positioned at substantially the same height from the major surface of the substrate 10 as the conductive layer WL of the lowermost level of the stairstep structure portion 72 of the upper layer side stacked body 92.

Accordingly, in this embodiment, the depths or the aspect ratios are substantially the same for the contact holes reaching the conductive layers WL of the same level in the stairstep structure portion 71 of the lower layer side stacked body 91 and the stairstep structure portion 72 of the upper layer side stacked body 92. For example, although sixteen corresponding contact holes are made in the case of a total of sixteen layers of the conductive layers WL, it is sufficient to change the depth of the contact hole over eight stages instead of sixteen stages. Thereby, when collectively etching the contact holes of the stairstep structure portion 71 of the lower layer side stacked body 91 and the contact holes of the stairstep structure portion 72 of the upper layer side stacked body 92, the etching conditions can be set easily; and the etching controllability can be increased.

A formation method of the contact structure of the semiconductor device according to this embodiment will now be described with reference to FIG. 5A to FIG. 12.

Prior to stacking the multiple conductive layers WL and the multiple insulating layers 25 above the substrate 10, transistors of the peripheral circuit are formed on the surface of the substrate 10 in the peripheral circuit region 6. To form the transistors of the peripheral circuit region 6, first, an element separation layer is formed to insulatively separate the transistors from each other. In this embodiment, the foundation layer 45b, which is formed to raise a portion of the lower layer side stacked body 91 described above, also is formed when forming the element separation layer.

The second contact region 5 where the foundation layer 45b is provided and the peripheral circuit region 6 are extracted and illustrated in FIG. 5A to FIG. 6C.

Figure 5A:
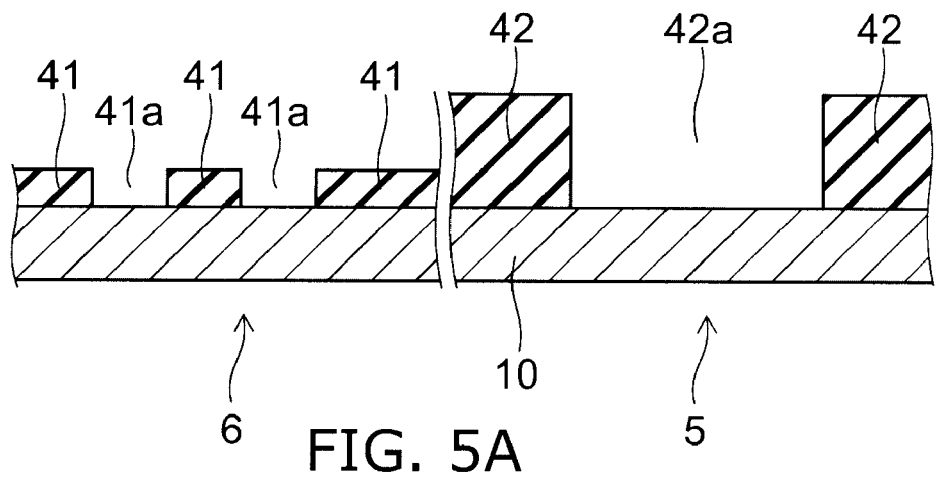
FIG. 5A to FIG. 12 are cross-sectional views showing a method for forming the contact structure.

The element separation layer has, for example, an Shallow Trench Isolation (STI) structure. First, as illustrated in FIG. 5A, a mask 41 is formed on the surface of the substrate 10 in the peripheral circuit region 6, and a mask 42 is formed on the surface of the substrate 10 in the second contact region 5. Openings 41a are selectively made in the mask 41, and openings 42a are selectively made in the mask 42. The mask 42 is thicker than the mask 41, and the opening 42a is deeper than the opening 41a.

Figure 5B:
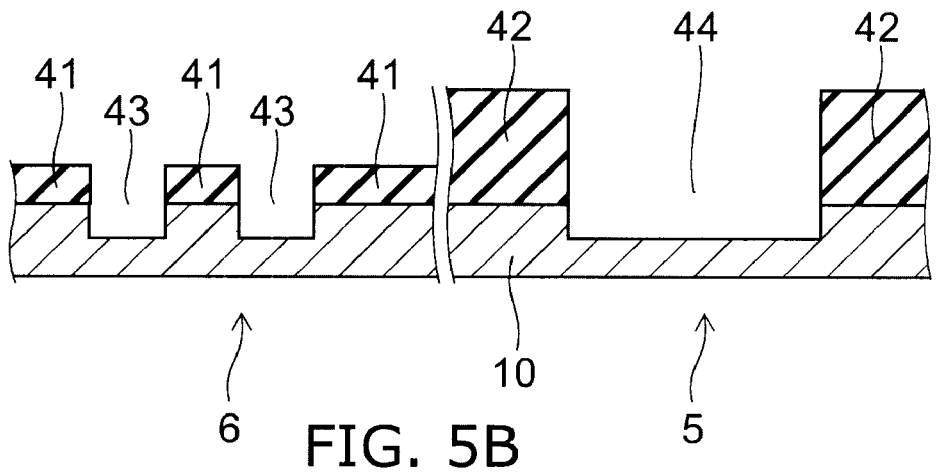

The substrate 10 is etched by, for example, Reactive Ion Etching (RIE) using the masks 41 and 42. Thereby, as illustrated in FIG. 5B, trenches are made in the surface side of the substrate 10 in the peripheral circuit region 6 and the second contact region 5. In FIG. 5B, the opening 41a and the trench below the opening 41a in the peripheral circuit region 6 are illustrated together as a trench 43. Similarly, the opening 42a and the trench below the opening 42a in the second contact region 5 are illustrated together as a trench 44. The mask 42 protrudes upward from the mask 41; and the trench 44 is deeper than the trench 43 by the amount that the mask 42 is thicker than the mask 41.

Figure 5C:
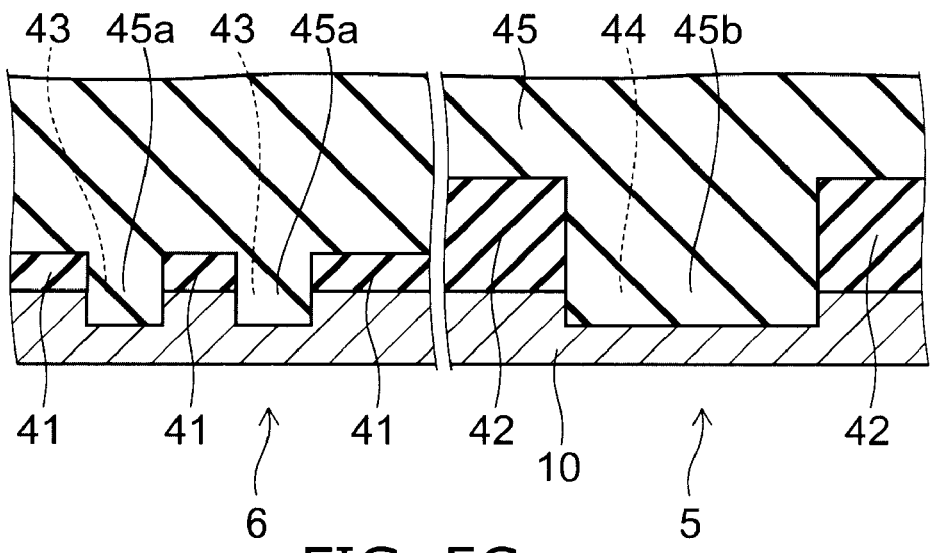

Then, as illustrated in FIG. 5C, an insulating layer (e.g., a silicon oxide layer) 45 is deposited in the peripheral circuit region 6 and the second contact region 5. The insulating layer 45 is filled into the trenches 43 and 44. The portion of the insulating layer 45 filled into the trench 43 in the peripheral circuit region 6 forms an element separation layer 45a to insulatively separate the transistors of the peripheral circuit from each other; and the portion of the insulating layer 45 filled into the trench 44 of the second contact region 5 forms the foundation layer 45b described above.

Figure 6A:
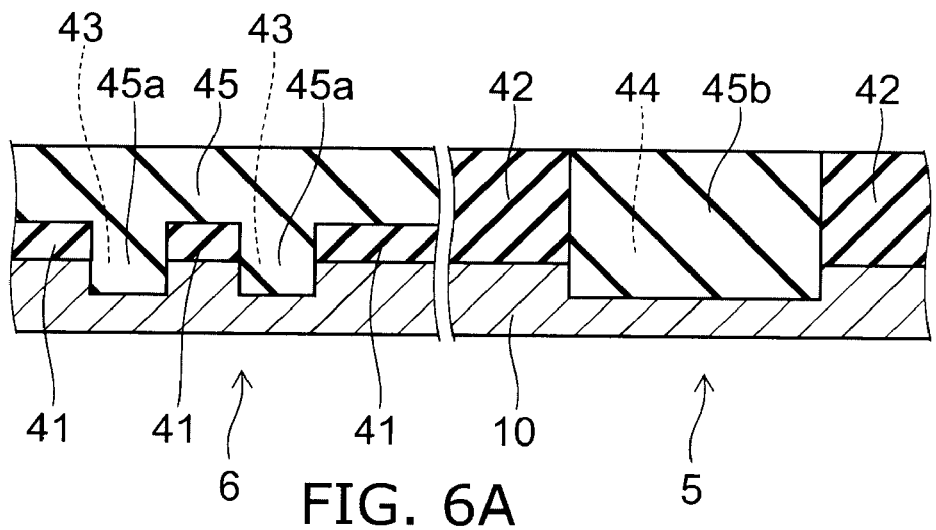
Figure 6B:
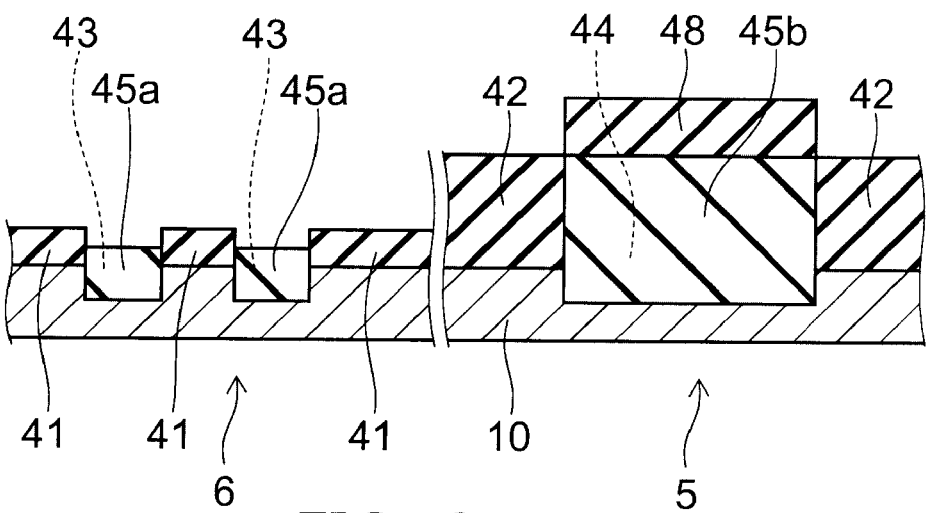

Then, after removing the insulating layer 45 on the mask 42 and the trench 44 in the second contact region 5 as illustrated in FIG. 6A, a mask 48 is formed on the foundation layer 45b in the trench 44 as illustrated in FIG. 6B. In such a state, the element separation layer 45a is etched to the desired level in the trench 43 of the peripheral circuit region 6.

Figure 6C:
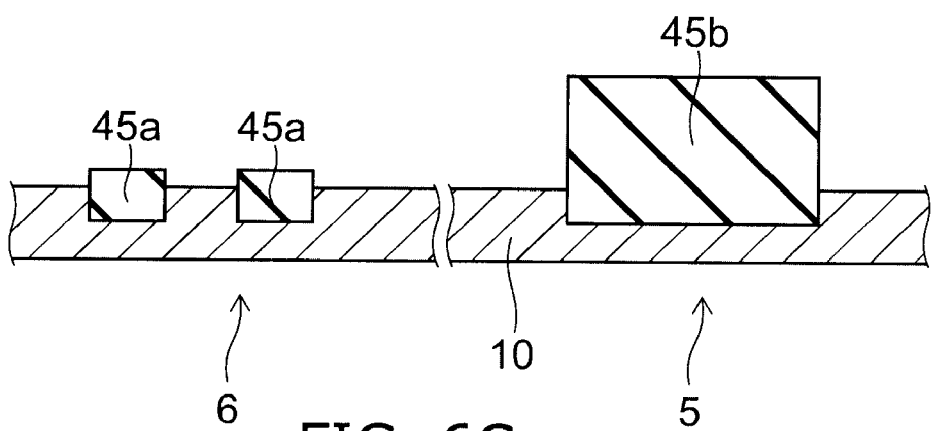

Subsequently, by removing the masks 41, 42, and 48, the element separation layer 45a and the foundation layer 45b, which have different heights protruding from the surface of the substrate 10, are formed in the peripheral circuit region 6 and the second contact region 5 as illustrated in FIG. 6C. The protrusion height of the foundation layer 45b from the surface of the substrate 10 is higher than that of the element separation layer 45a.

This embodiment is efficient and suppresses the increase of the number of processes because the foundation layer 45b, which is the structure to raise a portion of the lower layer side stacked body 91, is formed during the formation of the element separation layer 45a of the peripheral circuit region 6.

Then, the insulating layer 26 is formed over the entire surface of the substrate 10 including the memory cell region 1, the first contact region 4, the second contact region 5, and the peripheral circuit region 6. And the conductive layer 27 is formed on the insulating layer 26. The conductive layer 27 in the memory cell region 1 functions as the back gate BG. The conductive layer 27 in the peripheral circuit region 6 is patterned to function as the gate electrodes of the peripheral circuit transistors. Subsequently, the introduction of impurities and the like are performed on the surface of the substrate 10 in the peripheral circuit region 6 to form the drain regions and the source regions of the peripheral circuit transistors.

Figure 7:
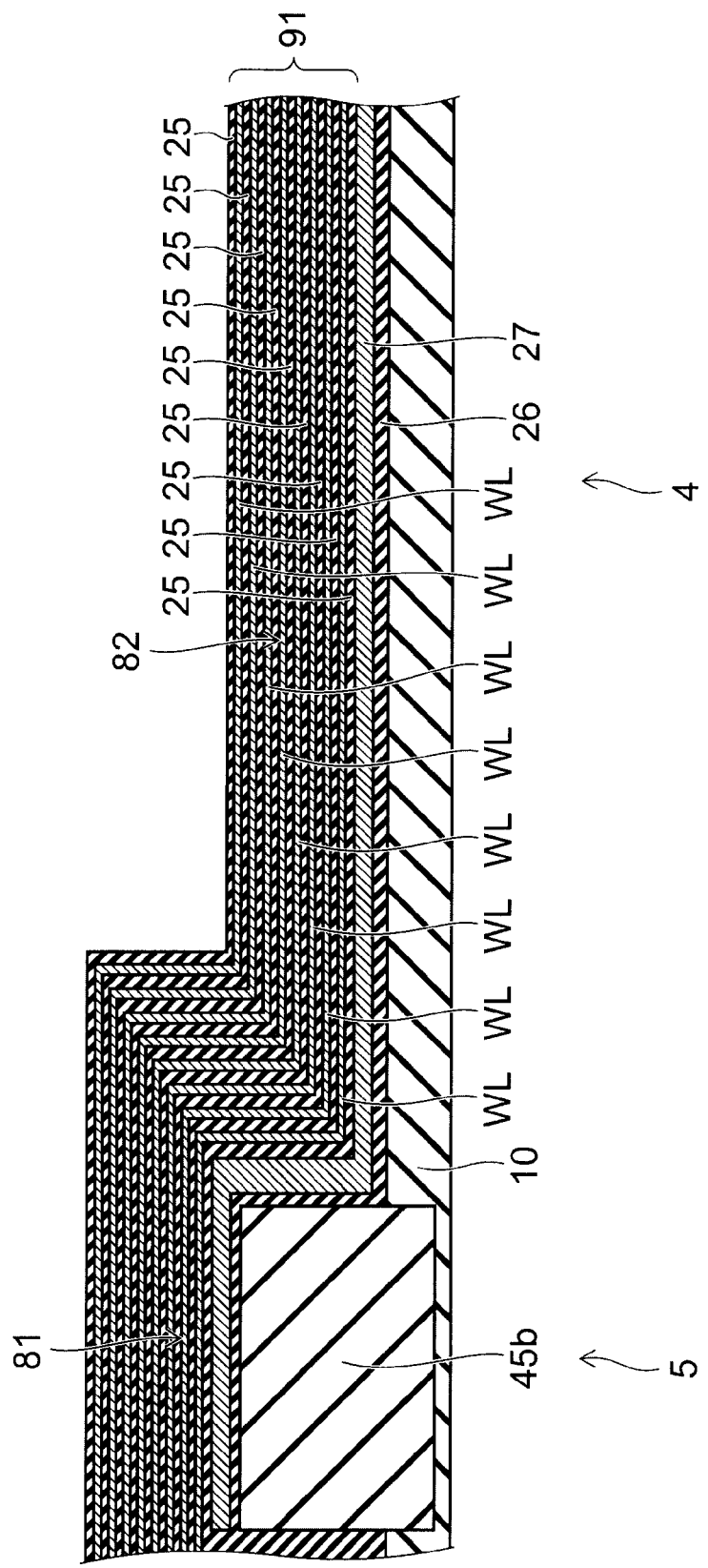

Continuing, the insulating layer 25 and the conductive layer WL are multiply stacked alternately on the conductive layer 27 to form the lower layer side stacked body 91 as illustrated in FIG. 7. The lower layer side stacked body 91 also is formed over the entire surface of the substrate 10 including the memory cell region 1, the first contact region 4, the second contact region 5, and the peripheral circuit region 6. The upper layer side stacked body 92 stacked subsequently also is formed over the entire surface of the substrate 10 including the memory cell region 1, the first contact region 4, the second contact region 5, and the peripheral circuit region 6. Providing the stacked body recited above also in the peripheral circuit region 6 prevents a large difference in levels from occurring in the chip. The conductive layers WL of the peripheral circuit region 6 are insulated from the transistors of the peripheral circuit region 6.

The insulating layer 26, the conductive layer 27, the insulating layer 25, and the conductive layer WL are formed by, for example, Chemical Vapor Deposition (CVD).

As illustrated in FIG. 7, a portion of the lower layer side stacked body 91 is formed up onto the foundation layer 45b. Thereby, the upper level portion 81 above the foundation layer 45b and the lower level portion 82 above the first contact region 4 are formed in the lower layer side stacked body 91.

Figure 8:
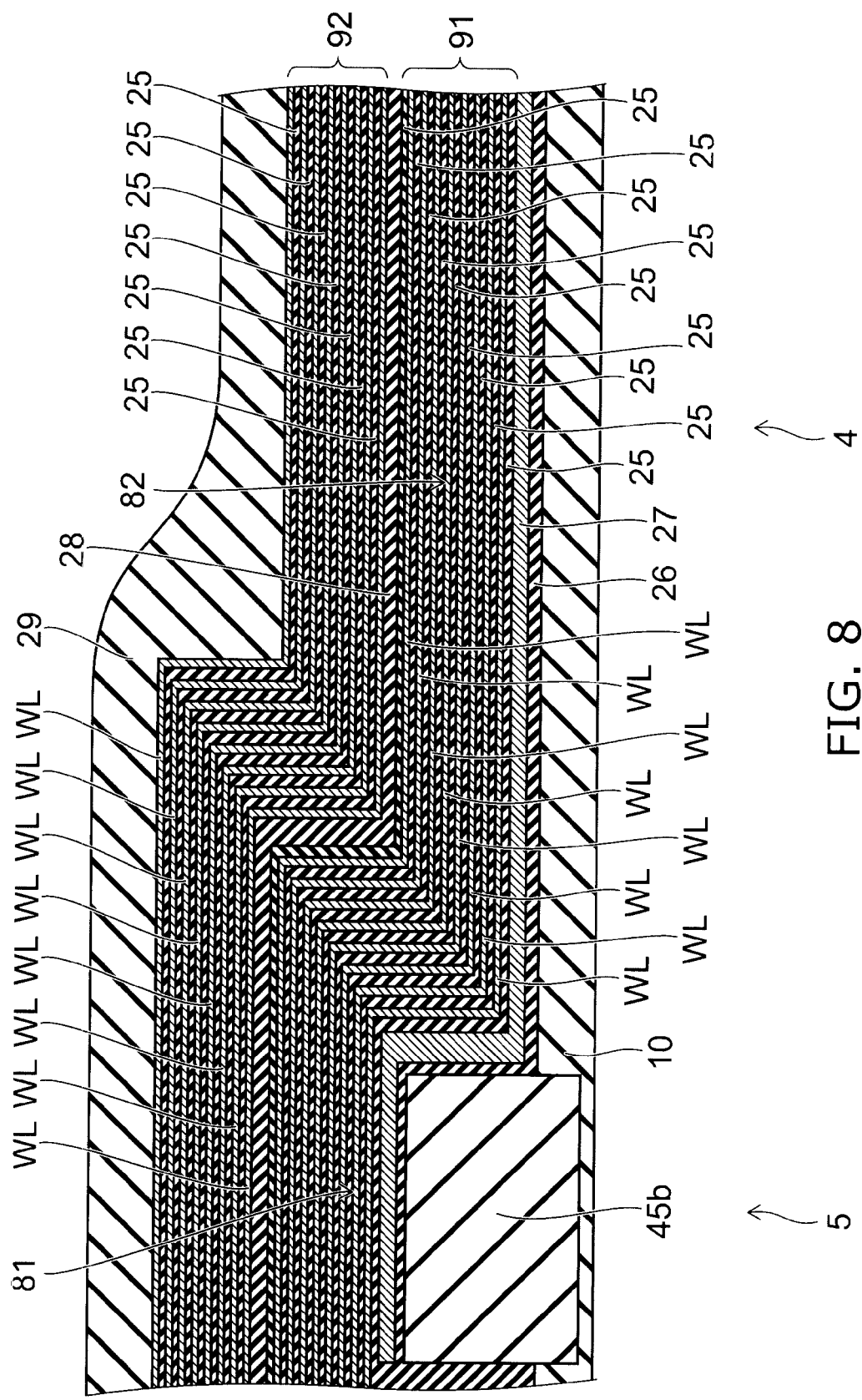

Then, as illustrated in FIG. 8, the insulating layer 28 is formed on the lower layer side stacked body 91; and the conductive layers WL and the insulating layers 25 are multiply stacked alternately on the insulating layer 28 to form the upper layer side stacked body 92. Further, an insulating layer 29 is formed on the upper layer side stacked body 92.

Figure 9:
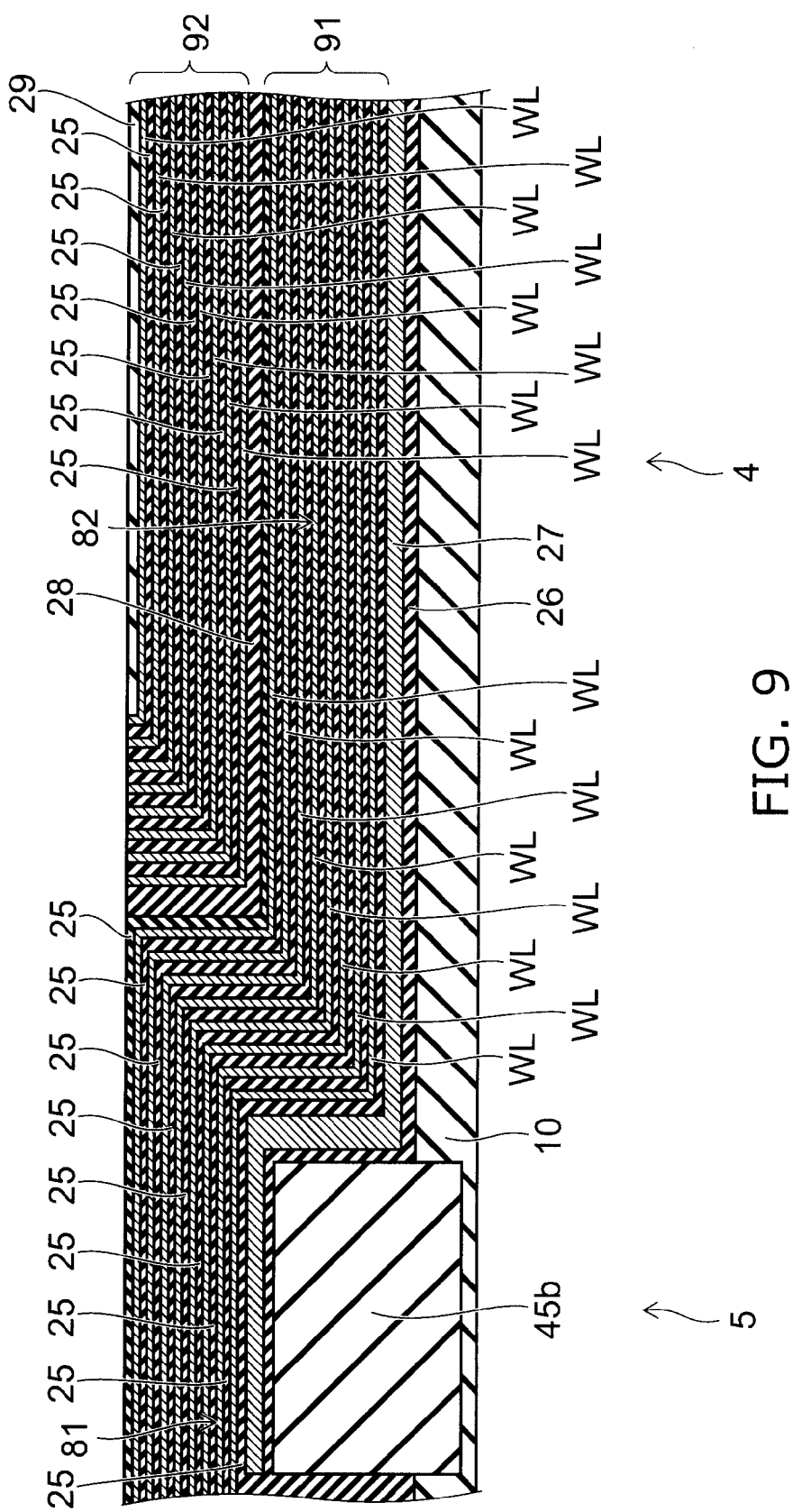

Then, the stacked body obtained by the processes recited above is polished by, for example, Chemical Mechanical Polishing (CMP) and planarized as illustrated in FIG. 9. Thereby, the upper layer side stacked body 92 on the upper level portion 81 of the lower layer side stacked body 91 is removed to expose the upper level portion 81 of the lower layer side stacked body 91. At this time, the insulating layer 28 provided between the upper level portion 81 of the lower layer side stacked body 91 and the upper layer side stacked body 92 stacked thereupon functions as a stopper layer of the CMP. Accordingly, it is desirable to form the insulating layer 28 relatively thickly to reliably prevent the lower layer side stacked body 91 from being polished. For example, the insulating layer 28 is thicker than the insulating layer 25 between the conductive layers WL.

Similarly, the insulating layer 29 provided on the upper layer side stacked body 92 functions as a stopper layer during the CMP of the upper layer side stacked body 92 above the first contact region 4. Accordingly, it is also desirable for the insulating layer 29 to be formed relatively thickly. For example, the insulating layer 29 is thicker than the insulating layer 25 between the conductive layers WL.

In this embodiment, in the state in which the upper face of the stacked body above the first contact region 4 and the second contact region 5 is planarized, the corresponding conductive layers WL of each level in the upper level portion 81 of the lower layer side stacked body 91 on the foundation layer 45b and the upper layer side stacked body 92 on the lower level portion 82 of the lower layer side stacked body 91 have substantially the same height from the surface of the substrate 10 as illustrated in FIG. 9. This is possible by, for example, appropriately adjusting the thickness of the foundation layer 45b and the thickness of the insulating layer 28 provided between the lower layer side stacked body 91 and the upper layer side stacked body 92.

A stacked body (including, e.g., sixteen layers of the conductive layers WL) in which the upper layer side stacked body 92 is stacked on the lower layer side stacked body 91 similarly to the stacked body above the first contact region 4 is provided in the memory cell region 1. The upper face of the stacked body of the memory cell region 1 also is planarized by the CMP recited above. After the planarizing, a conductive layer forming the drain-side select gate DSG and the source-side select gate SSG is further stacked via an insulating layer. Subsequently, the making of the memory holes, the formation of the charge storage layer 32, the formation of the channel body 20, etc., are performed to form the memory cell array illustrated in FIG. 2.

Although the conductive layer forming the drain-side select gate DSG and the source-side select gate SSG is provided also above the first contact region 4 and the second contact region 5, the conductive layer above the first contact region 4 and the second contact region 5 is removed.

Subsequently, the stairstep configuration patterning is performed on the upper level portion 81 of the lower layer side stacked body 91 and the upper layer side stacked body 92 on the first contact region 4.

Specifically, the slimming process that reduces the planar size of a resist film and the processes that etch one layer of the insulating layer 25 and one layer of the conductive layer WL using the resist film as a mask are multiply repeated.

Figure 10:
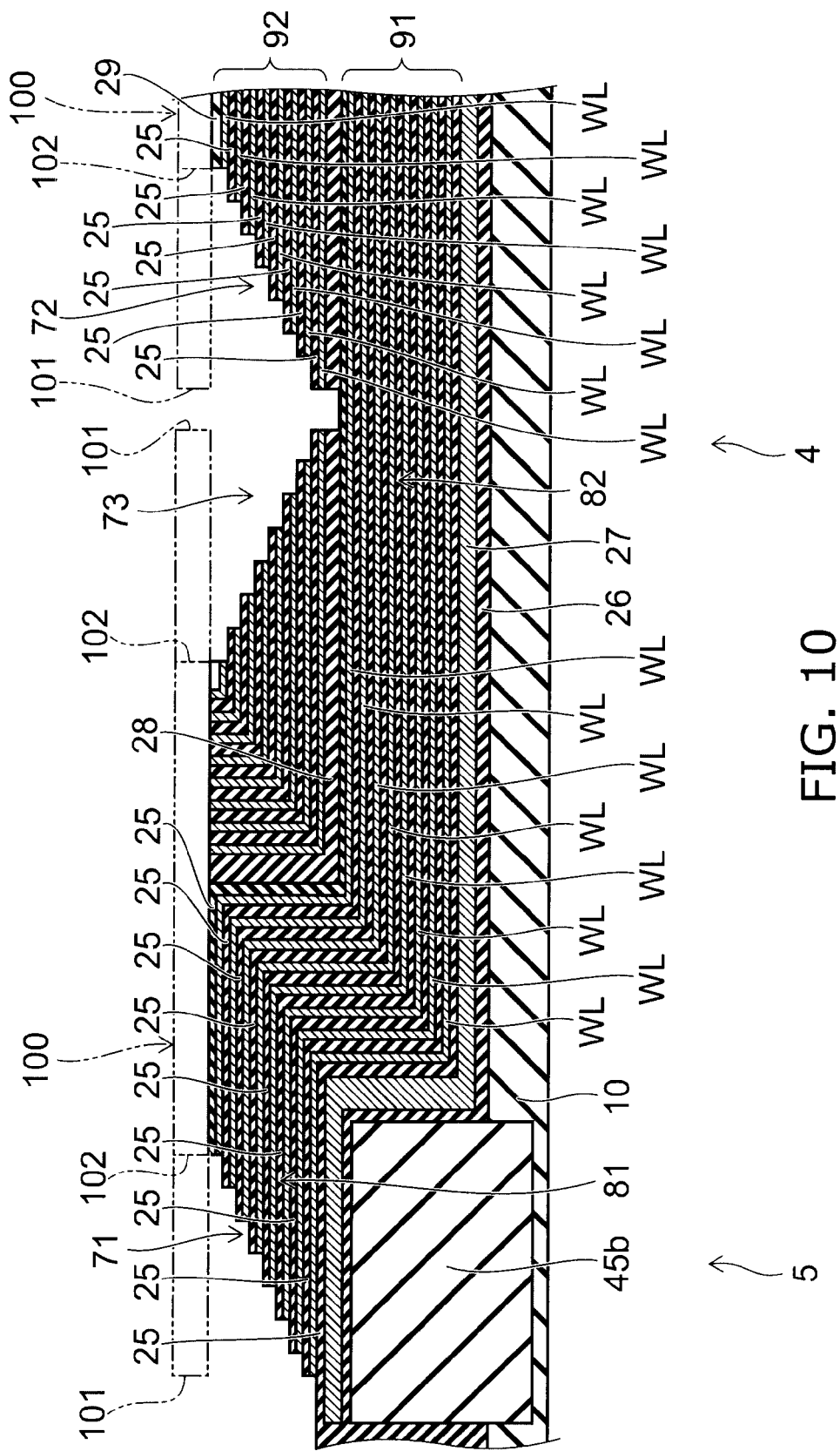

For example, the planar size of a resist film 100 illustrated by the double dot-dash line in FIG. 10 is reduced in stages from an initial edge 101 to an edge 102. Each time the planar size of the resist film 100 is slimmed one stage, one layer of the insulating layer 25 and one layer of the conductive layer WL exposed from the resist film 100 at that point in time are etched and removed.

Thereby, the stairstep structure portion 71 is formed in the upper level portion 81 of the lower layer side stacked body 91; and the stairstep structure portion 72 is formed in the upper layer side stacked body 92 above the first contact region 4. Although the upper layer side stacked body 92 also includes the stairstep structure portion 73 formed simultaneously with the formation of the stairstep structure portion 71 of the lower layer side stacked body 91, contact electrodes are not provided in the stairstep structure portion 73. In this embodiment, the contact electrodes of the upper layer side stacked body 92 are provided in the stairstep structure portion 72.

Figure 11:
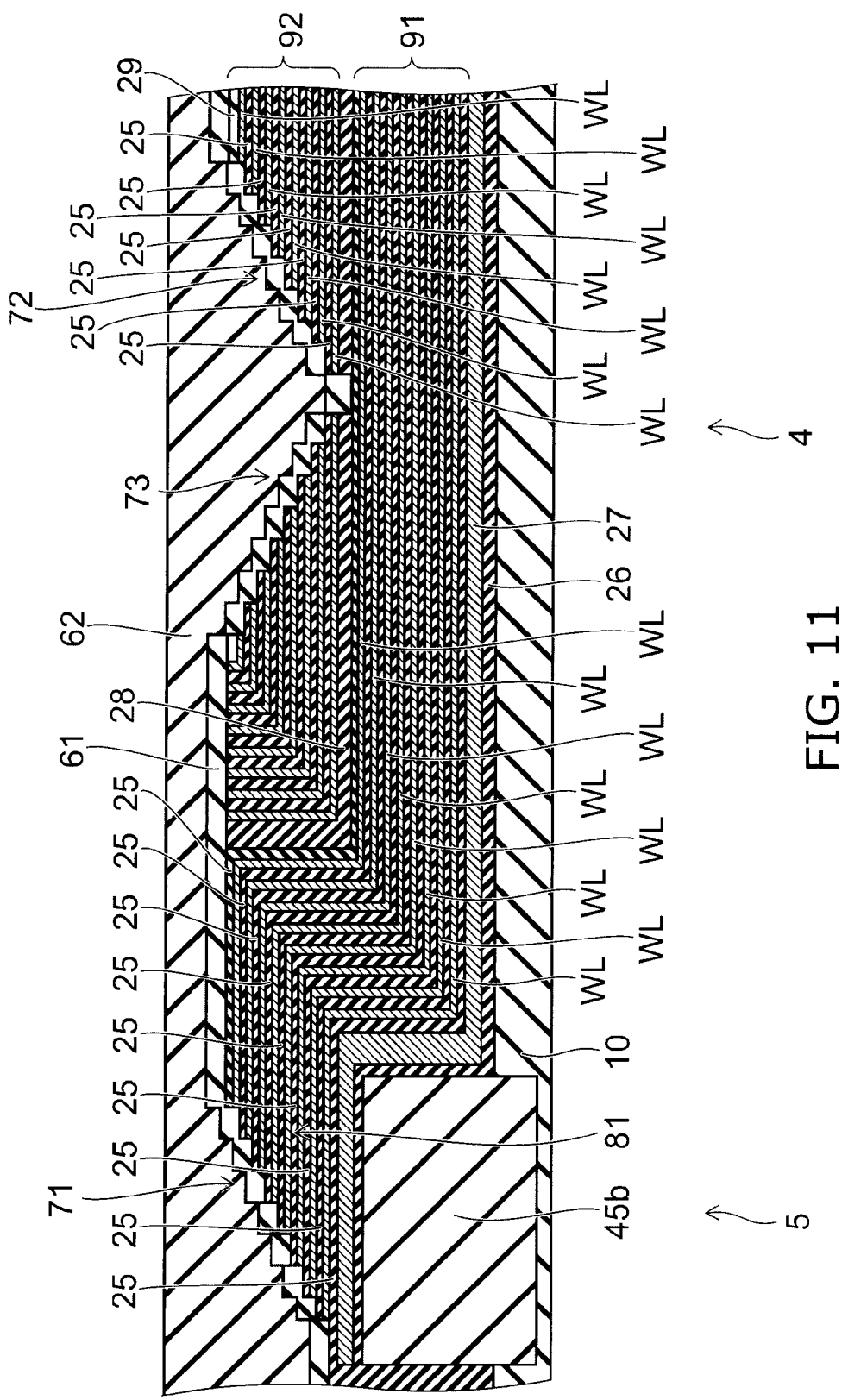

After forming the stairstep structure portions 71 and 72, the stopper film 61 is formed to cover the surfaces of the lower layer side stacked body 91 and the upper layer side stacked body 92 including the stairstep structure portions 71 and 72 as illustrated in FIG. 11. The stopper film 61 is made of, for example, silicon nitride. After forming the stopper film 61, the inter-layer insulating layer 62 is formed thereupon and planarized. The inter-layer insulating layer 62 is made of, for example, silicon oxide.

Figure 12:
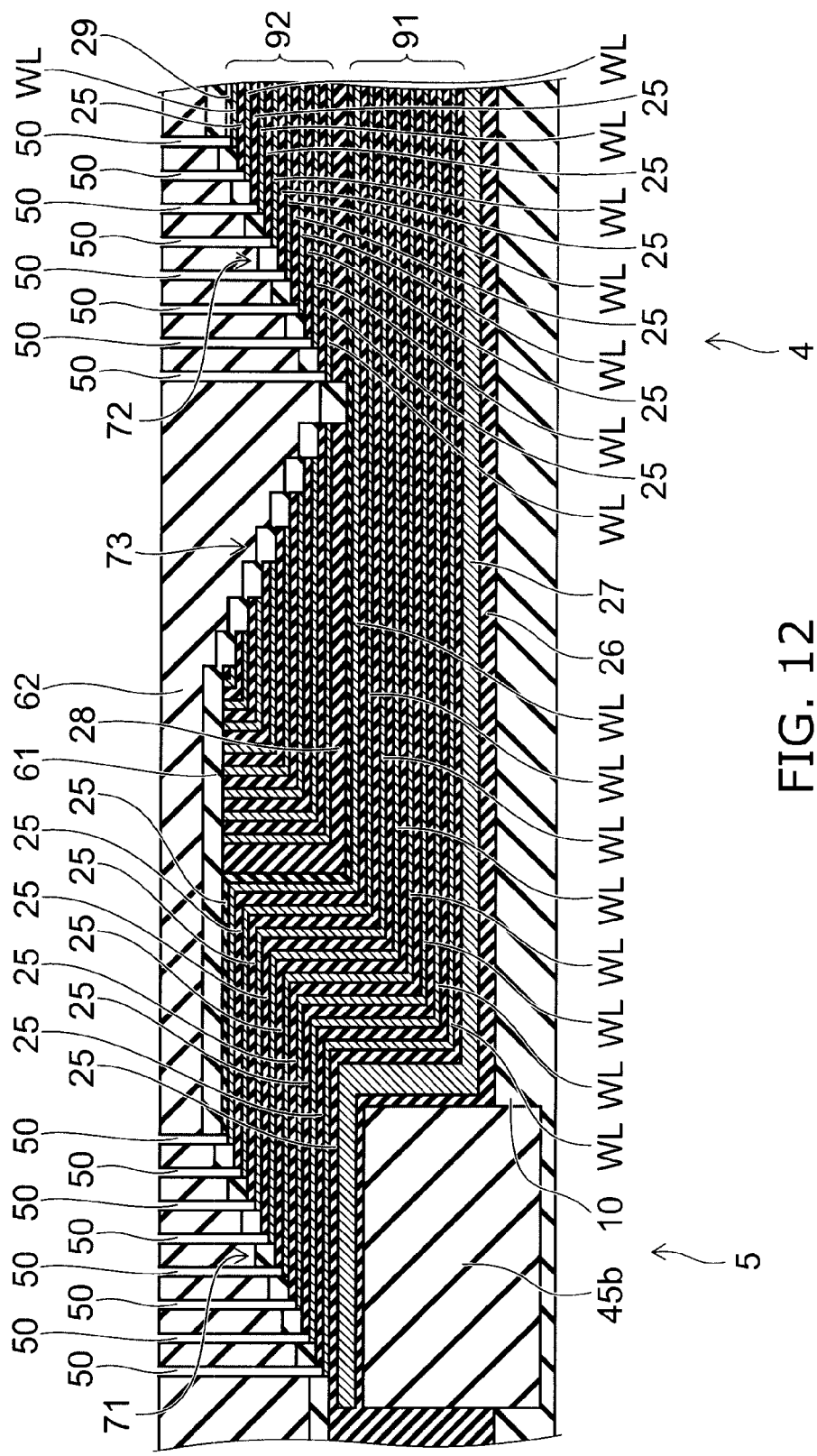

After forming the stopper film 61 and the inter-layer insulating layer 62, the multiple contact holes 50 are made collectively by, for example, RIE. The contact holes 50 are punched through the inter-layer insulating layer 62, the stopper film 61, and the insulating layer 25 below the stopper film 61 in the stairstep structure portions 71 and 72 as illustrated in FIG. 12. Each of the contact holes 50 reaches the conductive layer WL of the corresponding level.

According to this embodiment, by using the foundation layer 45b to raise a portion of the lower layer side stacked body 91, the depths or the aspect ratios of the contact holes 50 reaching the conductive layers WL of the stairstep structure portion 71 of the lower layer side stacked body 91 can be reduced. Thereby, the difference of the depth or the aspect ratio between the contact hole 50 reaching the conductive layer WL of the uppermost level and the contact hole 50 reaching the lowermost level in the stacked body in which the lower layer side stacked body 91 is combined with the upper layer side stacked body 92 is reduced. Therefore, the etching time to collectively make the multiple contact holes 50 corresponding to the number of layers of the conductive layers WL can be drastically shortened. Further, because the difference of the depth between the contact holes 50 can be reduced, excessive etching of shallow contact holes 50 can be suppressed. Thereby, shorts can be prevented between different conductive layers WL in which the contact hole 50 extends through to a conductive layer WL other than that of the intended connection.

Further, when forming the contact holes 50, the stopper film 61, which is silicon nitride, functions as an etching stopper during the etching of the inter-layer insulating layer 62, which is silicon oxide. Therefore, when collectively making the multiple contact holes 50 having different depths in the stairstep structure portions 71 and 72, differences of how much the etching progresses can be mitigated. Thereby, shallow contact holes 50 can be prevented from extending through to other conductive layers WL.

After forming the contact holes 50, the contact electrodes 51 are formed as illustrated in FIG. 4 by filling a conductive material into each of the contact holes 50. A titanium film, for example, is formed by CVD as a metal film for siliciding on, for example, the inner walls of the contact holes 50; and a titanium nitride film is formed by CVD to cover the titanium film. After forming such films, the resistance is reduced by performing heat treatment to react the silicon of the conductive layers WL with the titanium film to form titanium silicide at the portion of each of the conductive layers WL contacting the titanium film. Subsequently, the contact electrodes 51 are formed by filling, for example, tungsten into the contact holes 50 by CVD.

Although the stairstep structure portion 72 of the upper layer side stacked body 92 is provided between the foundation layer 45b and the memory cell region 1 in the embodiments described above, the stairstep structure portion 72 of the upper layer side stacked body 92 may be provided between the foundation layer 45b and the peripheral circuit region 6. In such a case as well, the upper layer side stacked body 92 on the upper level portion 81 of the lower layer side stacked body 91 above the foundation layer 45b is removed. By removing the upper layer side stacked body 92 on the upper level portion 81, the connections from the stairstep structure portion 72 of the upper layer side stacked body 92 between the foundation layer 45b and the peripheral circuit region 6 to the upper layer side stacked body 92 on the memory cell region 1 side via the portion on the upper level portion 81 are severed. However, the stairstep structure portion 72 of the upper layer side stacked body 92 between the foundation layer 45b and the peripheral circuit region 6 is connectable to the upper layer side stacked body 92 on the memory cell region 1 side by a portion formed to surround the periphery of the upper level portion 81.

The configuration of the memory string is not limited to the U-shaped configuration. An I-shaped configuration in which the multiple conductive layers WL are aligned in a straight line configuration in the stacking direction may be used. The insulating film structure between the conductive layers WL and the channel body 20 is not limited to the Oxide-Nitride-Oxide (ONO) structure. For example, a two-layer structure of a charge storage layer and a gate insulating film may be used.

Further, although a structure is illustrated in which the stacked body including the alternately stacked conductive layers WL and insulating layers 25 is divided into two portions, i.e., the lower side and the upper side, which are patterned into the stairstep configurations to connect to the upper layer interconnections, the stacked body may be divided into three or more portions patterned into stairstep configurations on the substrate 10 in which two or more differences in levels are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor device, comprising:
a substrate having a first contact region and a second contact region;
a foundation layer provided in the second contact region to form a difference in levels between the second contact region and the first contact region;
a lower layer side stacked body provided in the first contact region and the second contact region to cover the foundation layer, the lower layer side stacked body including a plurality of conductive layers stacked alternately with a plurality of insulating layers, an upper level portion of the lower layer side stacked body stacked on the foundation layer being patterned into a stairstep configuration;
an upper layer side stacked body provided on a lower level portion of the lower layer side stacked body stacked in the first contact region, the upper layer side stacked body including a plurality of conductive layers stacked alternately with a plurality of insulating layers, the upper layer side stacked body being patterned into a stairstep configuration;
an inter-layer insulating layer covering portions of the lower layer side stacked body and the upper layer side stacked body patterned into the stairstep configurations; and
a plurality of contact electrodes provided respectively in a plurality of contact holes punched through the inter-layer insulating layer to reach the conductive layers of the portions of the lower layer side stacked body and the upper layer side stacked body patterned into the stairstep configurations.

2. The device according to claim 1, further comprising a stopper film provided between the inter-layer insulating layer and the portions patterned into the stairstep configurations, the stopper film being of a material different from the inter-layer insulating layer.

3. The device according to claim 1, wherein a height from the substrate to a surface of the upper level portion of the lower layer side stacked body is substantially the same as a height from the substrate to a surface of the upper layer side stacked body.

4. The device according to claim 1, wherein the corresponding conductive layers of the same level of the portion of the lower layer side stacked body patterned into the stairstep configuration and the portion of the upper layer side stacked body patterned into the stairstep configuration are provided at substantially the same height from the substrate.

5. The device according to claim 1, wherein a thickness of the insulating layer of the lower layer side stacked body is substantially equal to a thickness of the insulating layer of the upper layer side stacked body.

6. The device according to claim 1, wherein a thickness of the conductive layer of the lower layer side stacked body is substantially equal to a thickness of the conductive layer of the upper layer side stacked body.

7. The device according to claim 1, further comprising a second insulating layer provided between the lower layer side stacked body and the upper layer side stacked body, a thickness of the second insulating layer being thicker than a thickness of the insulating layer of the lower layer side stacked body and a thickness of the insulating layer of the upper layer side stacked body.

8. The device according to claim 1, wherein the foundation layer is an insulating layer.

9. The device according to claim 1, wherein
the substrate further has a memory cell region including a stacked body including the lower layer side stacked body and the upper layer side stacked body, and
a memory hole is punched through the stacked body of the memory cell region, an insulating film including a charge storage layer is provided on a side wall of the memory hole, and a channel body is provided in the memory hole on an inner side of the insulating film.

10. The device according to claim 9, wherein the first contact region is provided between the memory cell region and the second contact region.

11. The device according to claim 9, wherein the portion of the upper layer side stacked body patterned into the stairstep configuration is provided between the memory cell region and the foundation layer.

12. The device according to claim 9, further comprising
a back gate provided below the stacked body,
the channel body being formed in a U-shaped configuration connected in an interior of the back gate.

* * * * *